(12) United States Patent
Cooney et al.

(10) Patent No.: US 9,722,336 B2
(45) Date of Patent: Aug. 1, 2017

(54) CIRCUIT BOARD WITH RESILIENT SEAL AS VAPOR BARRIER

(71) Applicant: Hamilton Sundstrand Corporation, Charlotte, NC (US)

(72) Inventors: Robert C. Cooney, Janesville, WI (US); John A. Dickey, Caledonia, IL (US); Christian Miller, Beloit, WI (US); Kevin Case Fritz, Rockfold, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 134 days.

(21) Appl. No.: 14/672,494

(22) Filed: Mar. 30, 2015

(65) Prior Publication Data
US 2016/0294083 A1    Oct. 6, 2016

(51) Int. Cl.
| | |
|---|---|
| *H01R 12/70* | (2011.01) |
| *H01R 13/52* | (2006.01) |
| *H01R 43/20* | (2006.01) |
| *H05K 3/32* | (2006.01) |

(52) U.S. Cl.
CPC ..... *H01R 12/7076* (2013.01); *H01R 13/5202* (2013.01); *H01R 43/205* (2013.01); *H05K 3/326* (2013.01); *H05K 2201/0314* (2013.01); *H05K 2201/09754* (2013.01); *H05K 2201/10189* (2013.01); *H05K 2201/10287* (2013.01)

(58) Field of Classification Search
CPC ............ H01R 13/5202; H01R 12/7076; H05K 2201/10287; H05K 2201/0314; H05K 2201/09754; H05K 2201/10189; H05K 3/326

USPC .......................................................... 439/78
See application file for complete search history.

(56) References Cited

U.S. PATENT DOCUMENTS

| | | |
|---|---|---|
| 3,877,769 A | 4/1975 | Berg et al. |
| 4,216,576 A | 8/1980 | Ammon et al. |
| 4,820,196 A | 4/1989 | Roselle et al. |
| 5,015,192 A * | 5/1991 | Welsh .................. H01R 12/716 29/843 |
| 5,102,712 A | 4/1992 | Peirce et al. |

(Continued)

FOREIGN PATENT DOCUMENTS

WO    2013017473    2/2013

OTHER PUBLICATIONS

European Search Report for European Patent Application No. 16162836 completed Sep. 22, 2016.

*Primary Examiner* — Edwin A. Leon
(74) *Attorney, Agent, or Firm* — Carlson, Gaskey & Olds, P.C.

(57) ABSTRACT

A circuit board has a socket with at least one plated through-hole. A connector includes a housing that has first and second connector interfaces with, respectively, at least first and second connector contacts. The first connector interface opens into an interior of the housing such that there is a vapor path through the first connector interface and the interior of the housing to the second connector contact at the second connector interface. A resilient seal is located at the first connector interface. The first connector contact extends through the resilient seal and into the plated through-hole. The resilient seal intimately seals around the first connector contact and provides a barrier at the first connector interface into the vapor path.

13 Claims, 2 Drawing Sheets

(56) References Cited

U.S. PATENT DOCUMENTS

| | | | |
|---|---|---|---|
| 5,683,256 A | 11/1997 | Werther | |
| 5,823,826 A * | 10/1998 | Ward | H01R 13/65802 439/620.07 |
| 5,886,111 A | 3/1999 | Chiotis et al. | |
| 6,059,591 A | 5/2000 | Bolen et al. | |
| 6,413,119 B1 * | 7/2002 | Gabrisko, Jr. | H01R 13/719 439/620.05 |
| 8,771,014 B2 | 7/2014 | Nakamura et al. | |

\* cited by examiner

CIRCUIT BOARD WITH RESILIENT SEAL AS VAPOR BARRIER

BACKGROUND

A circuit board can include an array of various electrical devices. Typically, such devices include a connector that permits the circuit board to be electrically connected to auxiliary components. The connector has a circuit board interface with contacts that electrically connect with plated through-holes in the circuit board. The connector also includes a mate interface with contacts to connect to a mating connector of the auxiliary components. A conformal coating can be applied to protect the circuit board and connector from moisture and other substances. Such coatings can be deposited by a vapor deposition process. A cap can be provided on the mating interface of the connector to limit infiltration of the vapor during the deposition process. The cap is then later removed for connection to the auxiliary component.

SUMMARY

A circuit board apparatus according to an example of the present disclosure includes a circuit board that has a socket with at least one plated through-hole. A connector includes a housing that has first and second connector interfaces with, respectively, at least first and second connector contacts. The first connector interface opens into an interior of the housing such that there is a vapor path through the first connector interface and the interior of the housing to the second connector contact at the second connector interface, and a resilient seal at the first connector interface. The first connector contact extends through the resilient seal and into the plated through-hole. The resilient seal intimately seals around the first connector contact and provides a barrier at the first connector interface into the vapor path.

In a further embodiment of any of the foregoing embodiments, the resilient seal has a hardness of 15 Shore-OO to 25 Shore-A.

In a further embodiment of any of the foregoing embodiments, a fully connected position with respect to the first connector contact extending into the plated through-hole, there is a gap thickness between the circuit board and the first connector interface, the resilient seal having an initial thickness that is at least 120% of the gap thickness.

In a further embodiment of any of the foregoing embodiments, the resilient seal has a pilot hole through which the first connector contact extends, the pilot hole initially being smaller in diameter than the first connector contact such that the pilot hole compresses around the first connector contact.

In a further embodiment of any of the foregoing embodiments, the pilot hole is approximately 50% to approximately 75% of the diameter of the first connector contact.

In a further embodiment of any of the foregoing embodiments, the resilient seal comprises a silicone material.

A further embodiment of any of the foregoing embodiments includes a conformal coating on the connector and the circuit board.

A method for fabricating a circuit board apparatus according to an example of the present disclosure includes providing a circuit board that has a socket with at least one plated through-hole, and providing a connector that has a housing with first and second connector interfaces that have, respectively, at least first and second connector contacts. The first connector interface opens into an interior of the housing such that there is a vapor path through the first connector interface and interior of the housing to the second connector contact at the second connector interface The first connector contact is inserted through the resilient seal and into the plated through-hole such that the resilient seal intimately seals around the first connector contact to provide a barrier at the first connector interface into the vapor path.

In a further embodiment of any of the foregoing embodiments, the inserting includes inserting the first connector contact through a pilot hole in the resilient seal, the pilot hole initially being smaller in diameter than the first connector contact such that the pilot hole compresses around the first connector contact upon insertion.

In a further embodiment of any of the foregoing embodiments, the inserting includes using the first connector contact to punch a hole through the resilient seal.

A further embodiment of any of the foregoing embodiments includes using a vapor to deposit a conformal coating on the connector and the circuit board, and using the resilient seal to limit infiltration of the vapor at the first connector interface into the vapor path and thereby limit deposition of the vapor onto the second connector contact at the second connector interface.

A circuit board seal according to an example of the present disclosure includes a resilient seal having a seal geometry configured to fit in a connector interface between a connector and a circuit board and intimately seal around a connector contact to provide a barrier at the connector interface into a vapor path through the connector.

In a further embodiment of any of the foregoing embodiments, the resilient seal has a hardness of 15 Shore-OO to 25 Shore-A.

In a further embodiment of any of the foregoing embodiments, the resilient seal has at least one pre-formed pilot hole.

In a further embodiment of any of the foregoing embodiments, the pre-formed pilot hole is approximately 50% to approximately 75% of a diameter of the connector pin.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
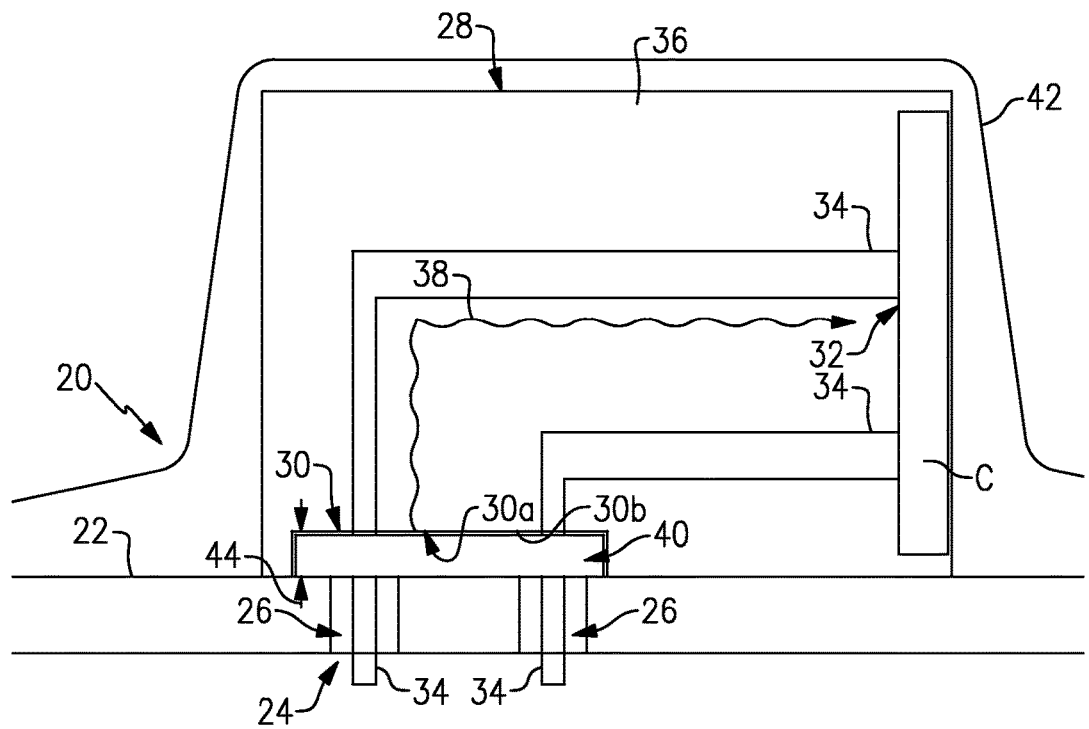
FIG. 1 illustrates an example circuit board apparatus having a resilient seal as a vapor barrier in a right angle configuration.

FIG. 1 illustrates an example circuit board apparatus 20. Circuit boards can include electrical connectors for electrically connecting the board to one or more auxiliary components. The circuit board and connectors may be sealed with a conformal coating to protect against infiltration of moisture or other substances that can compromise electrical connections. In this regard, the circuit board apparatus 20 includes a vapor barrier to limit infiltration moisture or other substances into the interior of such connectors and/or to limit infiltration of vapor during application of the conformal coating.

In this example, the circuit board apparatus 20 includes a circuit board 22 that has a socket 24 with at least one plated through-hole 26. The socket 24 may include a single plated through-hole 26 or an array of plated though-holes 26, depending on the requirements for electrical connection to the circuit board 22. The socket 24 with plated though-holes 26 permit connection with a connector 28. The socket 24 refers to one or more plated through-holes 26 that are grouped for a common connection and may or may not include other structural features on the circuit board 22.

The connector 28 is a dual-interface connector and includes first and second connector interfaces 30/32 with, respectively, corresponding connector contacts, generally represented at 34. The contacts 34 are illustrated as pins, but can alternatively be sockets. In this example, the contacts 34 at the first connector interface 30 are received into the corresponding plated through-holes 26 of the socket 24, while the contacts 34 at the second connector interface 32 will later be connected to a corresponding mating connector for electrical connection with an auxiliary component. The connector contact or contacts 34 at the first connector interface 30 thus correspond in number and location to the number and location of the plated through-hole or holes 26 of the socket 24. Additionally, the contacts 34 and holes 26 may be provided in a pattern to ensure fail-safe assembly of the connector 28 to the socket 24 such that the connector 28 cannot be installed in an improper orientation.

The connector 28 includes a housing 36 that defines the first and second connector interfaces 30/32. As an example, the housing 36 may be, but is not limited to, a molded plastic housing. In this example, the first connector interface 30 includes a mouth 30a that opens into an interior 36a of the housing 36. The mouth 30a may open directly into the interior 36a or, alternatively, may include a mouth floor 30b through which the contacts 34 extend. The opening into the interior 36a, either by direct opening or by gaps between the contacts 34 and the mouth floor 30b, provides a vapor path, represented generally at 38, through the first connector interface 30 and the interior 36a of the housing 28 to the contacts 34 at the second connector interface 32. Unless sealed, moisture or other substances may infiltrate through the first connector interface 30 to the interior 36 and accumulate onto the contacts 34 at the second connector interface 32. The accumulation can impair electrical contact between the contacts 34 at the second connector interface 32 and a mating connector.

In this regard, the circuit board apparatus 20 includes a resilient seal 40 located at the first connector interface 30. The contacts 34 of the first connector interface 30 extend through the resilient seal 40 and into the plated through-holes 26. The resilient seal 40 intimately seals around the contacts 34 and mouth 30a to provide a barrier at the first connector interface 30 to thereby limit infiltration of vapor into the vapor path 38. For example, the resilient seal 40 intimately seals by providing a constant resilience force against the contacts 34 and/or mouth 30a.

A conformal coating 42 can optionally be deposited over the connector 28 and circuit board 22 to protect the connector from moisture and substance infiltration once the circuit board apparatus 20 is in use. As an example, the coating can be, but is not limited to, a poly(p-xylylene) polymer coating. The coating 42 can be applied by vapor deposition. Unless sealed, the vapor during the vapor deposition may infiltrate through the first connector interface 30 into the connector 28 and deposit on the contacts 34 at the second connector interface 32, which is itself sealed with a cap, C, until connection with the mating connector. However, the intimate sealing of the resilient seal 40 around the contacts 34 and in the mouth 30a at the first connector interface 30 serves as a vapor barrier to limit infiltration into the vapor path 38. Even if such a coating 42 is not used, the resilient seal 40 can be utilized to limit infiltration of other vapors or substances into the interior 36a of the connector 28, for example other liquid conformal coatings.

Figure 2:
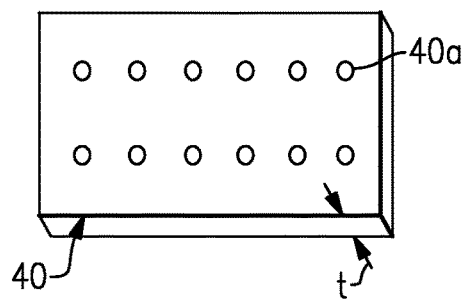
FIG. 2 illustrates an isolated view of an example resilient seal with pre-formed pilot holes.

The resilient seal 40 is a pre-fabricated seal that is assembled into position between the first connector interface 30 and the circuit board 22 during assembly of the circuit board apparatus 20. For example, FIG. 2 illustrates an isolated view of an example of the resilient seal 40. In this example, the resilient seal 40 has a rectangular geometry that is configured to fit in the first connector interface 30. That is, the first connector interface 30 is likewise rectangular such that the resilient seal 40 fits within the mouth 30a. Thus, the geometry of the resilient seal 40, whether rectangular or other shape, is configured to correspond to the geometry of the first connector interface 30.

The mouth 30a has a gap thickness 44 (FIG. 1) between the circuit board 22, which is flush with the sides of the mouth 30a, and the floor 30b of the mouth 30a. The resilient seal 40 has an initial thickness, t, defined with respect to the gap thickness 44 of the first connector interface 30. For instance, the initial thickness of the resilient seal 40 is greater than the gap thickness 44 by at least 120% such that once the connector 28 is in a fully connected position with respect to the contacts 34 being received into the plated through-holes 26, the resilient seal 40 is compressed to thereby maintain a resilient force in the mouth 30a. As can be appreciated, if the resilient seal 40 is too thick, the contacts 34 may not properly reach the plated though-holes 26, and if the resilient seal 40 is thin, there will be no resilient force to maintain intimate sealing in the mouth 30a.

In order to provide the proper level of resilience, and thus also resilient force, the resilient seal 40 is fabricated of a relatively soft, elastomeric material. As an example, the resilient seal 40 is fabricated of, but is not limited to, silicone or fluorosilicone. Silicone and fluorosilicone have relatively high temperature resistance and are resistant to degradation from moisture, oils and other substances. Silicone is a polymer that generally has a polymeric backbone of Si—O repeat units and organic side chains. Fluorosilicone is a sub-set of silicone and also has a polymeric backbone of Si—O repeat units, but includes fluorinated side chains. As a further example, the silicone or fluorosilicone material has a hardness of 15 Shore-OO to 25 Shore-A. Such a range is relatively soft and permits the resilient seal 40 to compress around the contacts 34 to provide a resilient force and good vapor barrier. However, if the resilient seal 40 is too soft, it will not resile and provide the intimate resilient force. If the resilient seal 40 is too hard, it will not sufficiently compress to provide the intimate resilient force.

Figure 3:
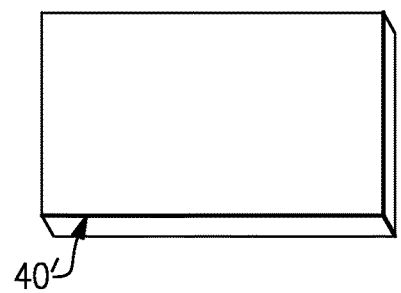
FIG. 3 illustrates an isolated view of another example resilient seal that does not have pre-formed pilot holes.

The resilient seal 40 can have pre-formed pilot holes, as shown in FIG. 2 at 40a or, alternatively, can have no pilot holes as shown in the alternate example resilient seal 40' in FIG. 3. The number and location of the pilot holes 40a, if used, corresponds to the number and location of the contacts 34 at the first connector interface 30. For example, each of the pilot holes 40 is smaller in diameter than the corresponding contact 34 such that each pilot hole compresses around the contacts 34 to provide the resilient force for intimate sealing. In a further example, the pilot hole 40a can have a diameter of approximately 50% to approximately 75% of the diameter of the contact 34.

Alternatively, if the pilot holes 40a are not used, the resilient seal 40' is soft enough to permit the contacts 34 to punch through the resilient seal 40' and into the plated through-holes 26, without significantly damaging or compromising the resilient seal 40'. In such an example, the contacts 34 thus self-form holes in the resilient seal 40'.

Figure 4:
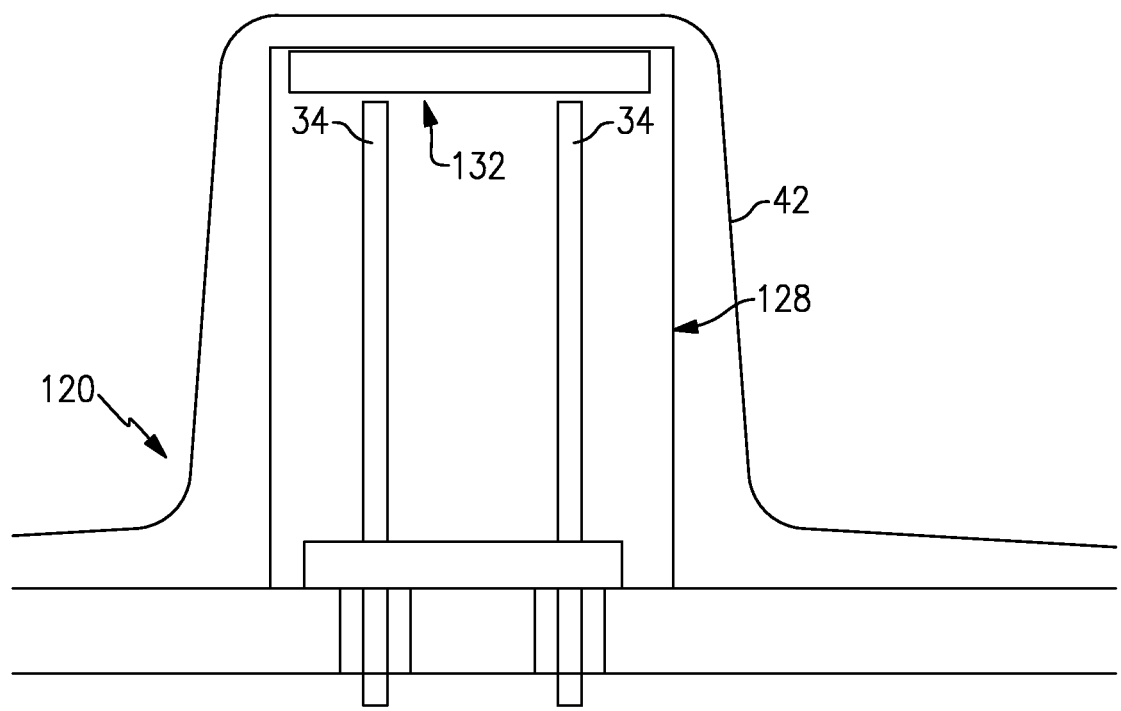
FIG. 4 illustrates another example circuit board apparatus that has a connector with a straight configuration with respect to mate interfaces.

FIG. 4 illustrates another example circuit board apparatus 120 that is similar to the circuit board apparatus 20 with the exception that the second connector interface 132 is on top of the connector 128 in a straight configuration rather than the right angle configuration of the circuit board apparatus 20.

A method for fabricating the circuit board apparatus 20/120 can include providing the circuit board 22 as described herein, providing the connector 28 as described herein, and inserting the contact or contacts 34 through the resilient seal 40/40' and into the plated through-hole or holes 26 such that the resilient seal 40/40' intimately seals around the contact or contacts 34 to provide a barrier at the first connector interface 30 into the vapor path 38. If the resilient seal 40 with the pilot holes 40a is used in the method, the contacts 34 are inserted through the pilot holes 40a. If the resilient seal 40' is used in the method, the contacts 34 are used to punch through the resilient seal 40' and into the plated through-holes 26. In either variation, the resilient seal 40/40' can either be applied i) onto the contacts 34 followed by applying the connector 28 with the resilient seal 40/40' to the socket 24 to fit the contacts 34 into the plated though-holes 26 or ii) onto the socket 24 followed by inserting the contacts 34 through the resilient seal 40/40' and into the plated through-holes 26. As can be appreciated, further variations of the method incorporate the features described with respect to the circuit board apparatus 20/120 herein.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A circuit board apparatus comprising:
a circuit board including a socket having at least one plated through-hole;
a connector including a housing having first and second connector interfaces with, respectively, at least first and second connector contacts, the first connector interface having a mouth defining a mouth floor, the mouth opening into an interior of the housing such that there is a vapor path through the first connector interface and the interior of the housing to the second connector contact at the second connector interface; and
a resilient seal at the first connector interface, the resilient seal being composed of a silicone material and having a hardness of 15 Shore-OO to 25 Shore-A, the first connector contact extending through the mouth floor and the resilient seal and into the plated through-hole, the resilient seal intimately sealing around the first connector contact and providing a barrier at the first connector interface into the vapor path, and, in a fully connected position with respect to the first connector contact extending into the plated through-hole, there is a gap thickness between the circuit board and the mouth floor, the resilient seal having an initial thickness that is at least 120% of the gap thickness.

2. The circuit board apparatus as recited in claim 1, wherein the resilient seal has a pilot hole through which the first connector contact extends, the pilot hole initially being smaller in diameter than the first connector contact such that the pilot hole compresses around the first connector contact.

3. The circuit board apparatus as recited in claim 2, wherein the pilot hole is approximately 50% to approximately 75% of the diameter of the first connector contact.

4. The circuit board apparatus as recited in claim 1, further including a conformal coating on the connector and the circuit board.

5. A circuit board seal comprising:
a resilient seal composed of a silicone material and having a hardness of 15 Shore-OO to 25 Shore-A, the resilient seal having a seal geometry configured to fit in a gap having a gap thickness between a connector and a circuit board and intimately seal around a connector contact to provide a barrier at the connector interface into a vapor path through the connector, the resilient seal having an initial thickness that is at least 120% of the gap thickness.

6. The circuit board seal as recited in claim 5, wherein the resilient seal has at least one pre-formed pilot hole.

7. The circuit board seal as recited in claim 6, wherein the pre-formed pilot hole is approximately 50% to approximately 75% of a diameter of the connector pin.

8. The circuit board apparatus as recited in claim 1, wherein the housing is composed of plastic and defines the mouth and the mouth floor.

9. The circuit board apparatus as recited in claim 8, wherein the first connector contact extends through a self-formed hole in the resilient seal.

10. The circuit board apparatus as recited in claim 8, wherein the resilient seal is composed of fluorosilicone.

11. The circuit board apparatus as recited in claim 1, wherein the first connector contact extends through a self-formed hole in the resilient seal.

12. The circuit board apparatus as recited in claim 1, wherein the second connector interface is sealed from being connected to a mating connector.

13. The circuit board apparatus as recited in claim 12, wherein a cap is disposed over the second connector interface, the cap sealing the second connector interface from being connected to the mating connector.

* * * * *

UNITED STATES PATENT AND TRADEMARK OFFICE
CERTIFICATE OF CORRECTION

PATENT NO. : 9,722,336 B2
APPLICATION NO. : 14/672494
DATED : August 1, 2017
INVENTOR(S) : Robert C. Cooney et al.

It is certified that error appears in the above-identified patent and that said Letters Patent is hereby corrected as shown below:

In the Claims

In Claim 5, Column 6, Line 33; after "a barrier at" replace "the connector interface" with
--a connector interface--

In Claim 7, Column 6, Line 41; after "a diameter of" replace "the connector pin" with
--a connector pin--

Signed and Sealed this
Tenth Day of July, 2018

Andrei Iancu
*Director of the United States Patent and Trademark Office*